US008185852B2

(12) United States Patent
Baumgartner et al.

(10) Patent No.: US 8,185,852 B2
(45) Date of Patent: *May 22, 2012

(54) PERFORMING MINIMIZATION OF INPUT COUNT DURING STRUCTURAL NETLIST OVERAPPROXIMATION

(75) Inventors: Jason R. Baumgartner, Austin, TX (US); Robert L. Kanzelman, Rochester, MN (US); Hari Mony, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 996 days.

This patent is subject to a terminal disclaimer.

(21) Appl. No.: 12/047,361

(22) Filed: Mar. 13, 2008

(65) Prior Publication Data

US 2008/0307372 A1 Dec. 11, 2008

Related U.S. Application Data

(63) Continuation of application No. 11/225,567, filed on Sep. 13, 2005, now Pat. No. 7,380,222.

(51) Int. Cl.
*G06F 17/50* (2006.01)
(52) U.S. Cl. ........................................ 716/106; 716/107

(58) Field of Classification Search ........... 716/106–108
See application file for complete search history.

(56) References Cited

U.S. PATENT DOCUMENTS

| 5,521,836 | A | 5/1996 | Hartoog et al. | |
|---|---|---|---|---|
| 6,038,382 | A * | 3/2000 | Kanazawa | 716/122 |
| 6,216,252 | B1 * | 4/2001 | Dangelo et al. | 716/102 |
| 6,662,323 | B1 | 12/2003 | Ashar et al. | |
| 7,356,792 | B2 * | 4/2008 | Baumgartner et al. | 716/106 |
| 7,370,292 | B2 * | 5/2008 | Baumgartner et al. | 716/112 |
| 7,380,222 | B2 * | 5/2008 | Baumgartner et al. | 716/106 |
| 2002/0100008 | A1 * | 7/2002 | Cheng et al. | 716/7 |
| 2004/0030974 | A1 | 2/2004 | Ashar et al. | |
| 2005/0081175 | A1 | 4/2005 | Scott et al. | |

* cited by examiner

*Primary Examiner* — Nghia Doan
*Assistant Examiner* — Binh Tat
(74) *Attorney, Agent, or Firm* — Yudell Isidore Ng Russell PLLC

(57) ABSTRACT

A method for performing verification is disclosed. The method includes selecting a set of gates to add to a first localization netlist and forming a refinement netlist. A min-cut is computed with sinks having one or more gates in the refinement netlist and sources comprising one or more inputs of an original netlist and one or more registers registers of the original netlist which are not part of the refinement netlist. A final localized netlist is obtained by adding one or more gates to the refinement netlist to grow the refinement netlist until reaching one or more cut-gates of the min-cut.

6 Claims, 11 Drawing Sheets

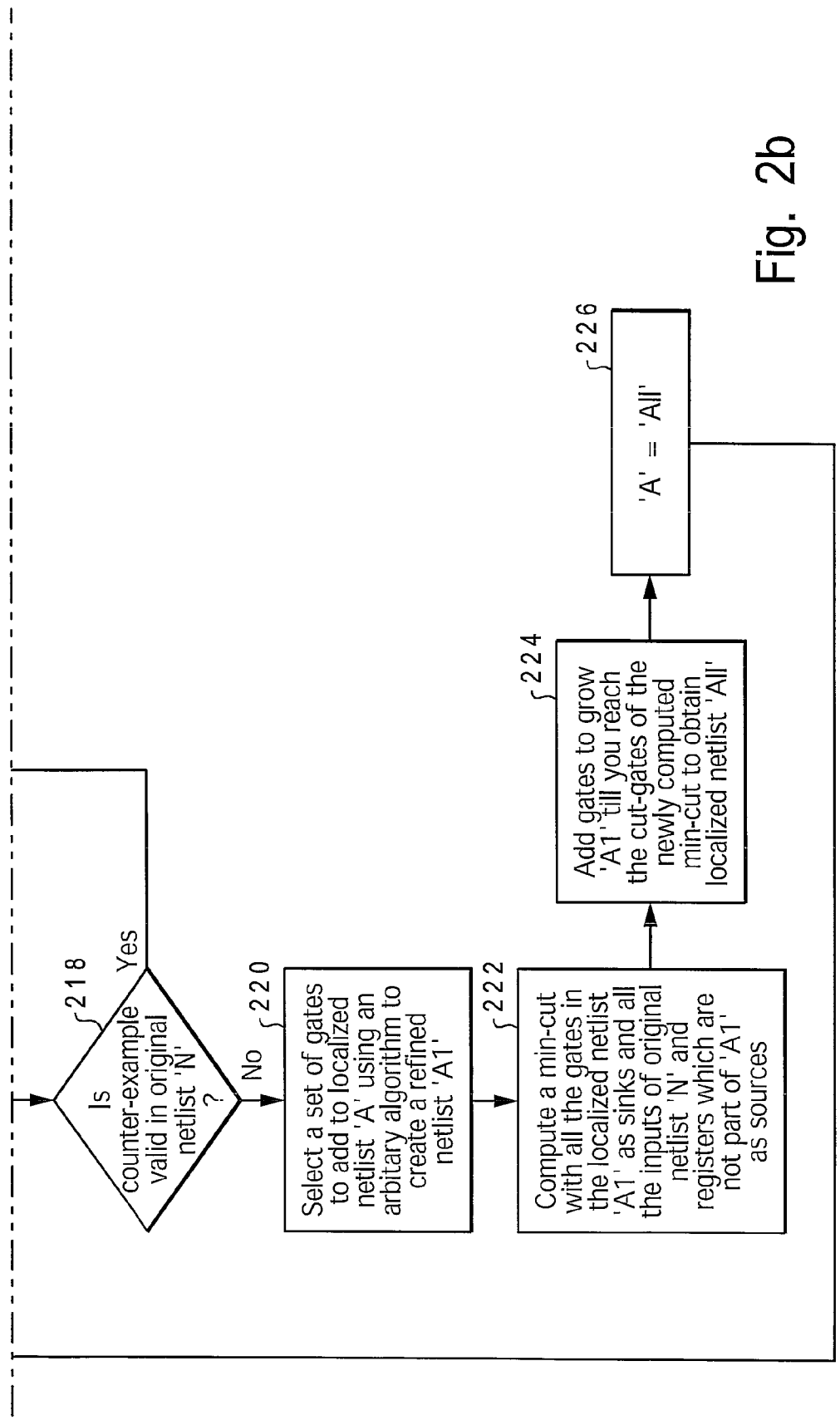

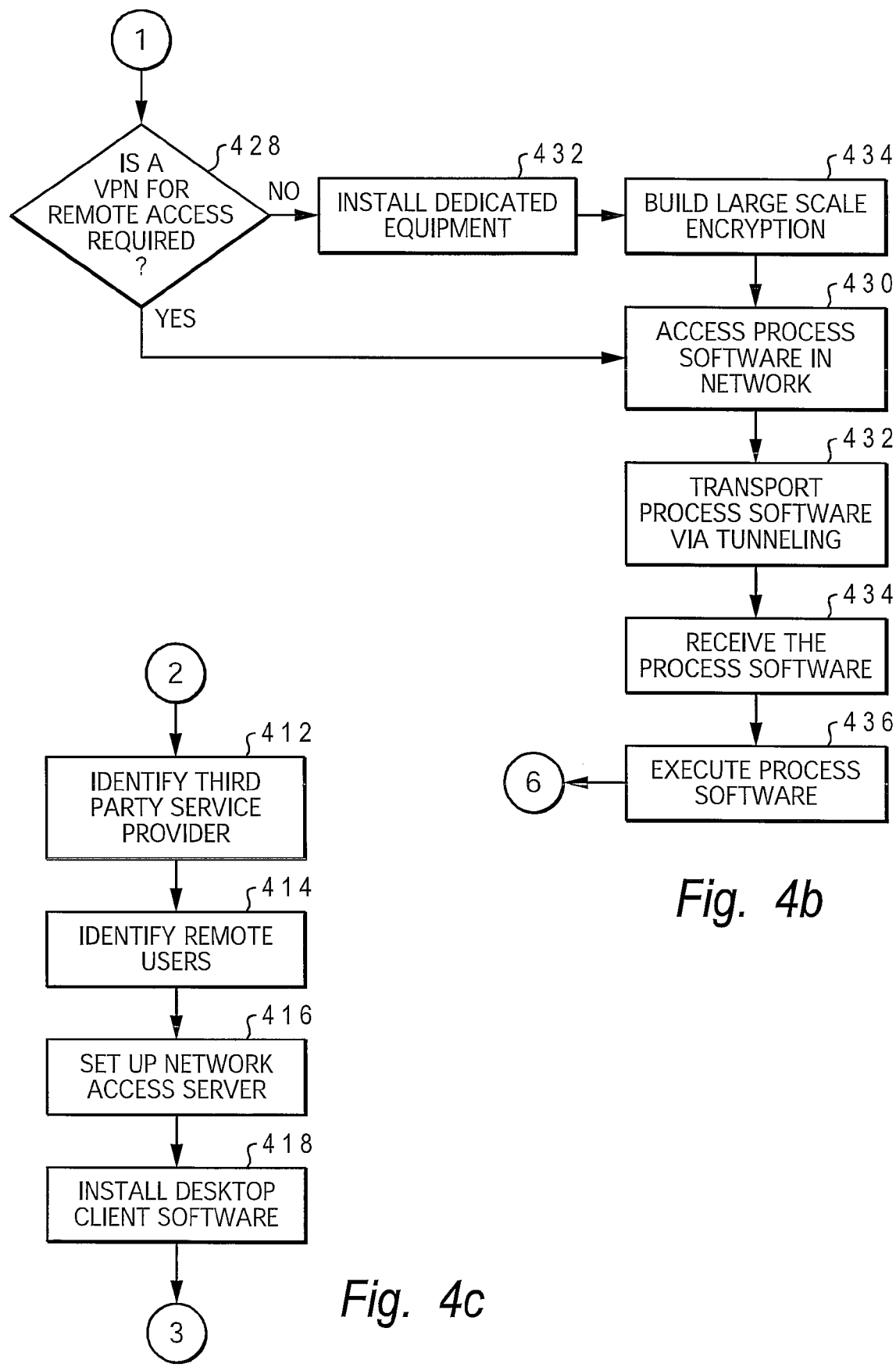

PERFORMING MINIMIZATION OF INPUT COUNT DURING STRUCTURAL NETLIST OVERAPPROXIMATION

The present application is a continuation of U.S. patent application Ser. No. 11/225,567, filed on Sep. 13, 2005, now U.S. Pat. No. 7,380,220 and entitled "Method and System for Performing Minimization of Input Count During Structural Netlist Overapproximation" which is assigned to the assignee of the present invention and incorporated herein by reference in its entirety.

BACKGROUND OF THE INVENTION

1. Field of the Invention

The present invention relates in general to verifying designs and in particular to verifying a logic function in a netlist. Still more particularly, the present invention relates to a system, method and computer program product for performing minimization of input count during structural netlist overapproximation.

2. Description of the Related Art

With the increasing penetration of microprocessor-based systems into every facet of human activity, demands have increased on the microprocessor development and production community to produce systems that are free from data corruption. Microprocessors have become involved in the performance of a vast array of critical functions, and the involvement of microprocessors in the important tasks of daily life has heightened the expectation of reliability of calculative results. Whether the impact of errors would be measured in human lives or in mere dollars and cents, consumers of microprocessors have lost tolerance for error-prone results. Consumers will not tolerate, by way of example, miscalculations on the floor of the stock exchange, in the medical devices that support human life, or in the computers that control their automobiles. All of these activities represent areas where the need for reliable microprocessor results has risen to a mission-critical concern.

Formal verification techniques, semiformal verification techniques and simulation provide powerful tools for discovering errors and verifying the correctness of logic designs. Formal verification techniques, semiformal verification techniques and simulation frequently expose probabilistically uncommon scenarios that may result in a functional design failure. Additionally, formal verification techniques provide the opportunity to prove that a design is correct (e.g., that no failing scenario exists).

One commonly-used approach to formal, semiformal, and simulation analysis for applications operating on representations of circuit structures is to represent the underlying logical problem structurally (as a circuit graph), and to perform explicit or symbolic evaluation of that circuit graph.

In such an approach, a logical problem is represented structurally. Explicit simulation-based approaches to hardware verification are scalable to very large designs, though suffer from the coverage problem that generally limits them to yielding exponentially decreasing coverage with respect to design size. Formal verification techniques overcome the coverage problem of simulation, yielding exhaustive coverage, though suffer from computational complexity that limits their application to smaller designs.

Formal verification techniques generally require exponential resources with respect to the number of state elements and inputs of a design under verification. Various techniques have been proposed to address the reduction in the number of state elements. For example, the technique of overapproximating the behavior of a design by replacing certain internal gates by inputs (referred to as "localization") has been proposed, which effectively causes any logic which fans out to the signals being referred to by a property solely through the injected cut-points to be removed from the domain of the verification problem. An unfortunate characteristic of localization is that the cut-point insertions tend to substantially increase the number of inputs in the design, which can be detrimental to subsequent proof analysis techniques sensitive to that metric, such as binary decision diagram-based reachability analysis.

Under the prior art, no adequate solution exists for performing minimization of input count during structural netlist overapproximation.

SUMMARY OF THE INVENTION

A method for performing verification is disclosed. The method includes selecting a set of gates to add to a first localization netlist and forming a refinement netlist. A min-cut is computed with sinks having one or more gates in the refinement netlist and sources comprising one or more inputs of an original netlist and one or more registers registers of the original netlist which are not part of the refinement netlist. A final localized netlist is obtained by adding one or more gates to the refinement netlist to grow the refinement netlist until reaching one or more cut-gates of the min-cut.

BRIEF DESCRIPTION OF THE DRAWINGS

The present invention is described in a preferred embodiment in the following description with reference to the drawings, in which like numbers represent the same or similar elements, as follows:

FIGS. 2a-b is a high-level logical flow chart of a process for performing minimization of input count during structural netlist overapproximation in accordance with a preferred embodiment of the present invention;

FIGS. 4a-c show a flow-chart of steps taken to deploy in a Virtual Private Network (VPN) software that is capable of executing the steps shown in FIG. 2;

DETAILED DESCRIPTION OF A PREFERRED EMBODIMENT

The present invention provides a system, method and computer program product for performing minimization of input count during structural netlist overapproximation. The present invention includes a novel min-cut based localization refinement method tuned for yielding a safely overapproximated netlist with minimal input count. Unlike traditional prior art approaches, which refine entire next-state functions or individual gates, the present invention augments gate-based refinement by adding logic within a min-cut over the combinational logic driving the localized cone to minimize localized input count while also avoiding the addition of unnecessary registers.

Unlike prior art approaches that eliminate gates from the refinement, and hence are prone to introducing spurious counterexamples, the present invention adds gates to the refinement, and hence avoids this risk. Prior art approaches resolve spurious counterexamples caused by cut-point insertion by adding registers, whereas the present invention performs refinement at the level of individual gates, avoiding the addition of unnecessary registers while preserving minimal input count. The present invention is also often able to yield a localization with lesser input count due to its ability to safely inject cut-points at gates which are sequentially driven by registers included in the localization. The present invention also helps ensure that the overapproximated initial value cones have minimal input count.

Figure 1:
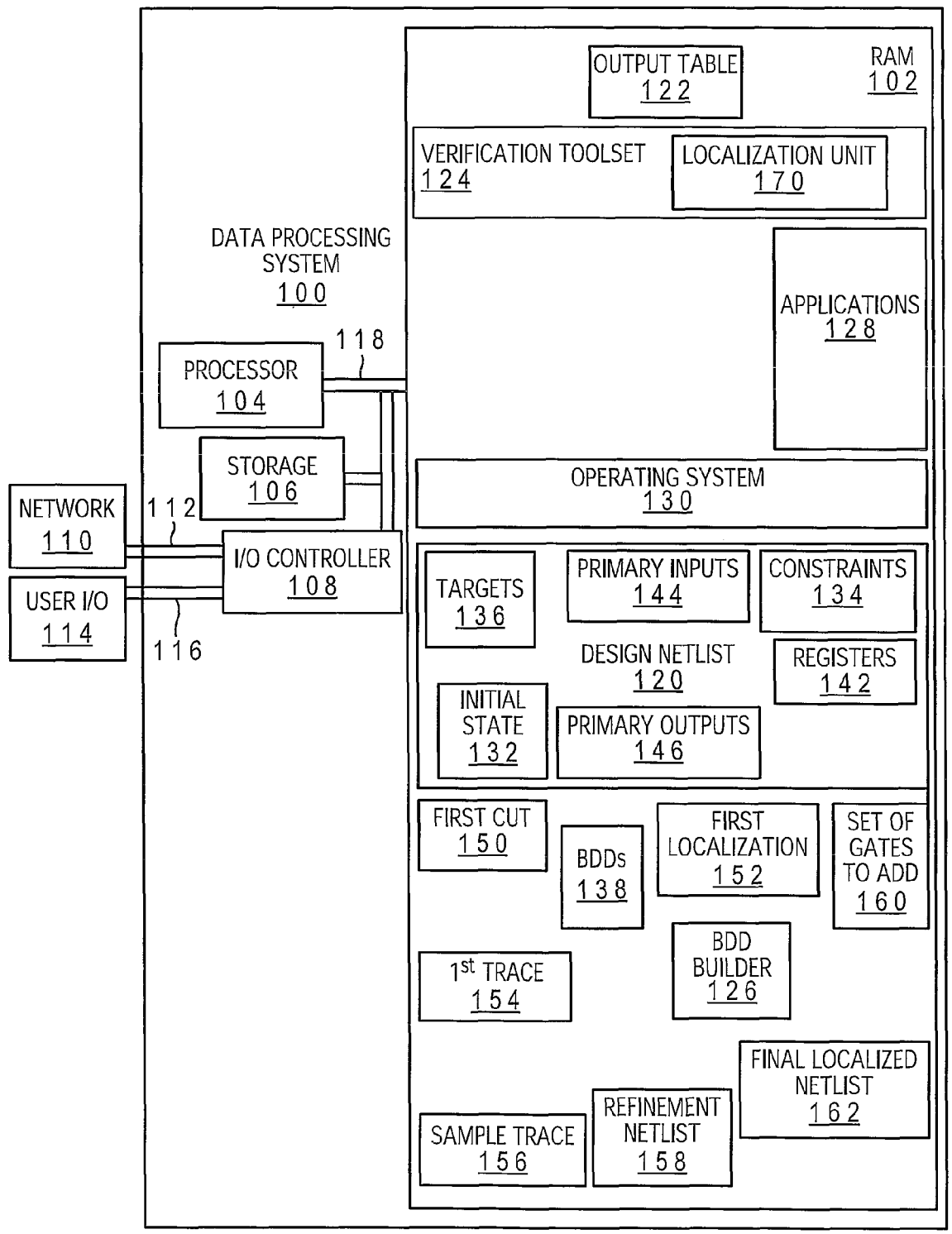
FIG. 1 illustrates a block diagram of a general-purpose data processing system with which the present invention of a system, method and computer program product for performing minimization of input count during structural netlist overapproximation may be performed.

With reference now to the figures, and in particular with reference to FIG. 1, a block diagram of a general-purpose data processing system, in accordance with a preferred embodiment of the present invention is depicted. Data processing system 100 contains a processing storage unit (e.g., RAM 102) and a processor 104. Data processing system 100 also includes non-volatile storage 106 such as a hard disk drive or other direct-access storage device. An Input/Output (I/O) controller 108 provides connectivity to a network 110 through a wired or wireless link, such as a network cable 112. I/O controller 108 also connects to user I/O devices 114 such as a keyboard, a display device, a mouse, or a printer through wired or wireless link 116, such as cables or a radio-frequency connection. System interconnect 118 connects processor 104, RAM 102, storage 106, and I/O controller 108.

Within RAM 102, data processing system 100 stores several items of data and instructions while operating in accordance with a preferred embodiment of the present invention. These include a design netlist 120, a binary decision diagram builder 126 for building binary decision diagrams (BDDs) 138 and an output table 122 for recording results from a verification toolset 124 containing a localization unit 170. Other applications 128 and verification toolset 124 interface with processor 104, RAM 102, I/O control 108, and storage 106 through operating system 130. While discussion of the present invention centers on BDD-based verification techniques, verification toolset 124 is capable of performing BDD or SAT based verification in the course of performing the present invention. The present invention can be used in any verification framework which performs localization on a netlist representation of a verification problem. The verification toolset can then use any proof technique on the resulting localized netlist. One skilled in the data processing arts will quickly realize that additional components of data processing system 100 may be added to or substituted for those shown without departing from the scope of the present invention. Other data structures within RAM 102 include a first cut 150, a first localization 152, a $1^{st}$ trace 154, a sample trace 156, a refinement netlist 158, a set of gates to add 160, and a final localized netlist 162.

A netlist graph, such as design netlist 120, is a popular means of compactly representing problems derived from circuit structures in computer-aided design of digital circuits. Such a representation is non-canonical and offers some ability to analyze the function from the nodes in the graph. A netlist contains a directed graph with vertices representing gates and edges representing interconnections between those gates. The gates have associated functions, such as constants, constraints 134, targets 136, an initial state 132 of the design, primary inputs 144, primary outputs 146, combinational logic (e.g., AND gates), and sequential elements (hereafter referred to as registers 142). Registers 142 have two associated components; their next-state functions and their initial-value functions, which are represented as other gates in the graph. Semantically, for a given register 142, the value appearing at its initial-value gate at time '0' ("initialization" or "reset" time) will be applied as the value of the register 142 itself; the value appearing at its next-state function gate at time "i" will be applied to the register itself at time "i+1".

Binary decision diagrams 138 are a popular choice for efficiently applying Boolean reasoning to problems derived from circuit structures, which are frequently represented in netlist graphs. Binary decision diagrams 138 offer a compact and canonical representation of the Boolean function of a graph node, which expedites reasoning regarding a node's function.

Processor 104 executes instructions from programs, often stored in RAM 102, in the course of performing the present invention. In a preferred embodiment of the present invention, processor 104 executes verification toolset 124. Verification toolset 124 performs the creation of binary decision diagrams 138 through the operation of binary decision diagram builder 126 on the circuit specifications contained in design netlist 120, which contains instructions for modeling a simulated item of logical hardware.

In a preferred embodiment, the present invention is applied to a design netlist 120 representation where the only combinational gate type is a 2-input AND, and inverters are represented implicitly as edge attributes.

Targets 136 represent nodes whose Boolean expressions are of interest and need to be computed. The goal of the verification process is to find a way to drive a '1' on a target node, or to prove that no such assertion of the target is possible. In the former case, a "counterexample trace" showing the sequence of assignments to the inputs in every cycle leading up to the fail event getting triggered is generated and recorded to output table 122.

Verification toolset 124 includes a computer program product, stored in RAM 102 and executed on processor 104, which provides a series of tools for activities such as equivalence checking, property checking, logic synthesis and false-paths analysis. Generally speaking, verification toolset 124 contains rule-based instructions for predicting the behavior of logically modeled items of hardware.

Verification toolset 124 uses the series of rules contained in its own instructions, in conjunction with design netlist 120, to represent the underlying logical problem structurally (as a circuit graph), and uses binary decision diagram builder 126 to construct binary decision diagrams 138, thereby converting the structural representation into a functionally canonical form. In a preferred embodiment, verification toolset 124 includes a Cycle-Based Symbolic Simulator (CBSS), which performs a cycle-by-cycle simulation on design netlist 120 symbolically by applying unique random, or non-deterministic, variables to the netlist inputs in every cycle.

At each step the Boolean expressions, represented as BDDs 138, corresponding to each node in design netlist 120 are computed until the expressions for all "sink" nodes (i.e. nodes labeled as primary outputs, targets 136, constraints 134 and next-state functions of registers 142) are obtained. At each step of the simulation the Boolean expressions of the target nodes are tested for being non-zero. If so, a counterexample trace leading up to the failure (represented by the assertion of the target node to a '1') is returned to output table 122. Constraints 134 need to be factored in before this check for the targets being hit can be done. This factoring is typically accomplished by simply ANDing the Boolean expression for the target with the Boolean expression for each of the constraints.

A Cycle-Based Symbolic Simulator (CBSS), such as is contained in verification toolset 124, performs a cycle-by-cycle symbolic simulation on a netlist representation of the design in design netlist 120 symbolically by applying unique random, or non-deterministic, variables to inputs in design netlist 120 at every cycle. Verification toolset 124 essentially performs forward BDD-based bounded symbolic simulation, starting from initial state 132. Verification toolset 124 extends the cycle simulation methodology to symbolic values. Verification toolset 124 applies symbolic functions to the inputs in every cycle and propagates them to the targets 136. At each step the Boolean expressions, represented as binary decision diagrams 138, corresponding to each node in design netlist 120 are computed until the expressions for all "sink" nodes, i.e. nodes labeled as primary outputs 146, targets 136, constraints 134 and next-state functions of registers 142, are obtained.

At each step of the simulation the Boolean expressions of the target 136 nodes are tested for being non-zero. If so, a counterexample trace leading up to the failure (represented by the assertion of the target node to a '1') is returned and reported to output table 122. If unsolved targets 136 remain, then the registers 142 are updated with the values, represented as binary decision diagrams 138, of the next-state functions, and the process continues. At every step of the verification process, there is a potential for a blow-up in memory when computing the binary decision diagrams 138 for any of the sink nodes.

A "cut" of design netlist 120, such as first cut 150, represents a partition of design netlist 120 into two graphs, where the only directed path from gates in the "source" graph to the "sink" graph flow through the gates comprising the cut.

A localization of a design netlist 120, such as first localization 152 is obtained by first computing cut of design netlist 120, such as first cut 150, such that all the gates corresponding to targets 136 are part of the sink graph and by replacing the gates comprising first cut 150 with RANDOM gates. A RANDOM gate is evaluated as an unconstrained source of random bit-streams in the verification process.

The localization renders first localization netlist 152 as an overapproximated netlist, which can simulate the original design netlist 120, though the converse might not be true. Because the overapproximation may result in a spurious assertion of a target 136, refinement is used to tighten the overapproximation by increasing the size of the localized netlist in design netlist 120 using the method following embodied in the following pseudocode:
1. For each target "t" in the original design netlist 120.
2. Begin with an initial first localization netlist 152 such that target "t" is part of first localization netlist 152.
3. Attempt to prove or falsify target "t" in the localized first localization netlist 152.
4. If target "t" is proven unreachable, this result is valid for the original design netlist 120; return the result to output table 122.
5. If a sample trace 156 is obtained asserting target "t" in the localized first localization netlist 152, search for a corresponding first trace 154 in the original design netlist 120. If corresponding first trace 154 is found, return this result to output table 122.
6. Otherwise, the sample trace 156 trace over the first localization netlist 152 is spurious. Identify a refinement netlist 158, which is a refinement of the first localization netlist 152, i.e., by adding a set of gates to the first localization netlist 152 to eliminate the spurious assertion.
7. Repeat step 3 with the refinement netlist 158.

In practice, first localization netlist 152 could contain many thousands of inputs when using traditional approaches. Such a large input count tends to render the BDD-based reachability analysis which is commonly used for the proof analysis in step 3 of the above method infeasible.

The min-cut based localization refinement method of the present invention (to address the input growth during localization) can be expressed as a pseudocode as follows:
1. Select a set of gates to add 160 to first localization netlist 152 to create a refinement netlist 158.
2. Compute a min-cut with all the gates in the refinement netlist 158 as sinks and all the inputs of the original netlist and registers which are not part of refinement netlist 158 as sources.
3. Add gates to grow refinement netlist 158 until you reach the cut-gates of the newly computed min-cut to obtain the final localized netlist 162. Note that the newly-added gates are all combinational due to the way sources and sinks are selected.

In step 1, a new refinement netlist 158 is created from first localization netlist 152 by adding a set of refinement gates (set of gates to add 160), which may be selected using any of the numerous refinement schemes known to those skilled in the art. The present invention performs the refinement at the granularity of individual gates rather than entire next state functions to avoid locking unnecessary logic into the localization. In step 2, min-cut is computed and in step 3, the present invention adds set of gates to add 160 to refinement netlist 158 to create final localized netlist 162, attempting to ensure that the final localized netlist 162 contains as few inputs as inputs while containing the original localization refinement of step 1.

Figure 2A:
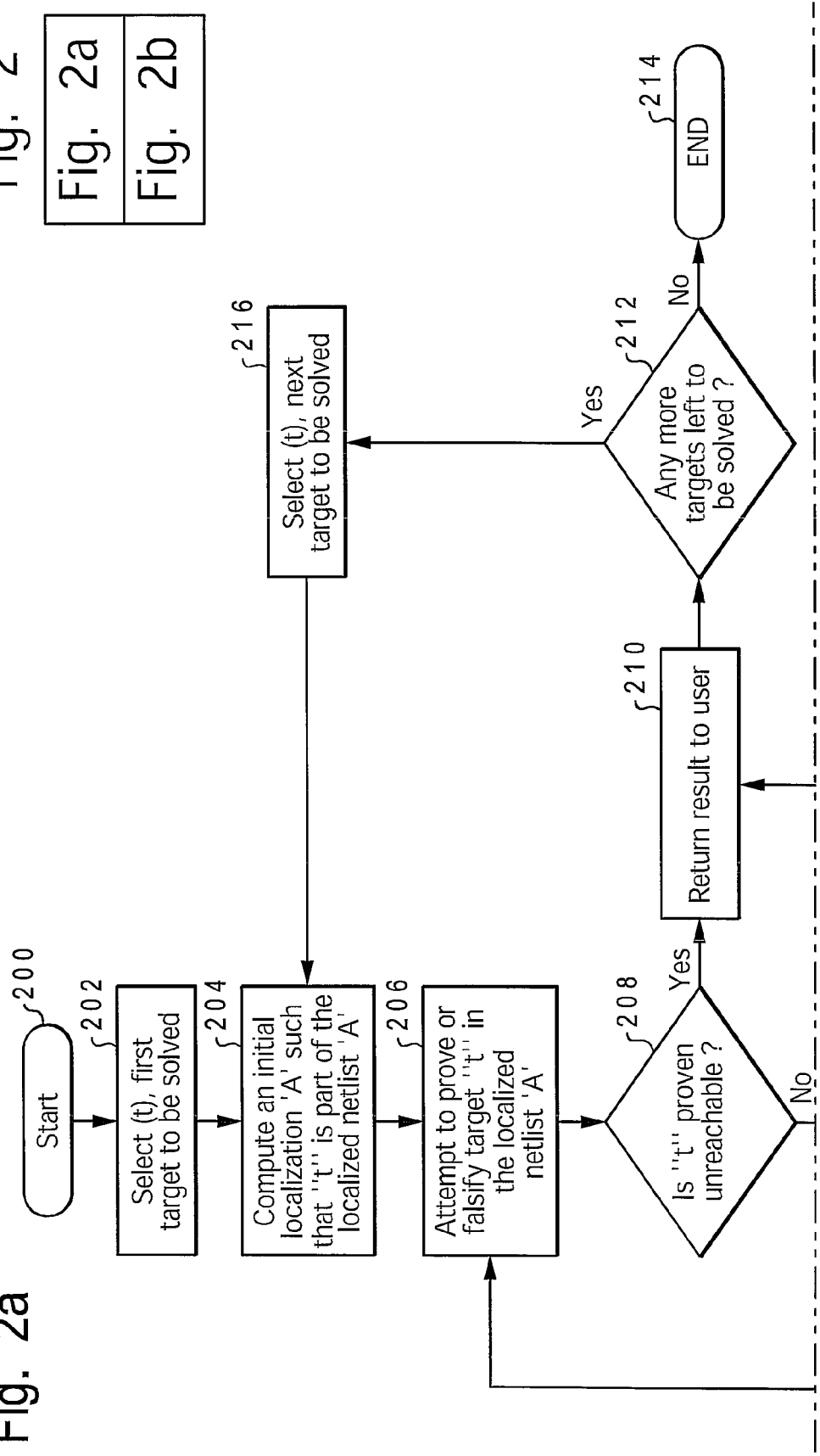

Turning now to FIG. 2, a high-level logical flowchart of a processor performing minimization of input count during structural netlist overapproximation is presented. The process starts at step 200, and then proceeds to step 202. At step 202, localization unit 170 selects a first target (t), from among targets 136, to be solved. The process then moves to step 204, which depicts localization unit computing a first localization 152 such that the target (t) selected in step 202 is part of first localization 152. The process next proceeds to step 206. At step 206, verification toolset 124 attempts to prove or falsify the target (t), selected in step 202, in first localization 152.

The process then moves to step 208, which depicts verification toolset 124 determining whether the target (t) selected in step 202 is proven unreachable. If verification toolset 124 determines that the target (t) is proven unreachable, then the process next moves to step 210, which depicts verification toolset 124 returning a result to the user through output table 122. The process then proceeds to step 212. At step 212, verification toolset 124 determines whether any more targets 136 remain to be solved. If verification toolset 124 determines that no targets 136 remain to be solved, then the process ends at step 214. If, however, verification toolset 124 determines that additional targets 136 remain to be solved, then the process moves to step 216 which depicts verification toolset 124 selecting a target (t) as the next target to be solved.

Returning to step 208, if verification toolset 124 determines that the target (t) has not been proven unreachable, then the process next moves to step 218, which depicts verification toolset 124 determining whether a valid counter-example exists in design netlist 120. If verification toolset 124 determines that a valid counter-example exists in design netlist 120, then the process returns to step 210, which is described above. If, in step 218 verification toolset 124 determines that no valid counter-example exists in design netlist 120, then the process proceeds to step 220.

At step 220, localization unit 170 selects a set of gates to add 160 to first localization 152 to create refinement netlist 158. The process then moves to step 222, which depicts localization unit 170 computing a min-cut, such as first cut 150, with all the gates in refinement netlist 158 as sinks and all the inputs and design netlist 120 and registers 142 which are not part of refinement netlist 158 as sources. The process then moves to step 224. At step 224, localization unit 170 adds gates to refinement netlist 158 to reach the cut-gates of the newly computed minimum cut in first cut 150 to obtain final localized netlist 162. The process then moves to step 226, which illustrates localization unit 170 setting first localization 152 equal to final localized netlist 162.

Accordingly, the present invention may suitably be embodied as a computer program product for use with a computer system. Such an implementation may comprise a series of computer readable instructions either fixed on a tangible medium, such as a computer readable medium, for example, diskette, CD-ROM, ROM, or hard disk, or transmittable to a computer system, via a modem or other interface device, over either a tangible medium, including but not limited to optical or analog communications lines, or intangibly using wireless techniques, including but not limited to microwave, infrared or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink-wrapped software, pre-loaded with a computer system, for example, on a system RON or fixed disk, or distributed from a server or electronic bulletin board over a network, for example, the Internet or World Wide Web.

Software Deployment

Figure 3A:
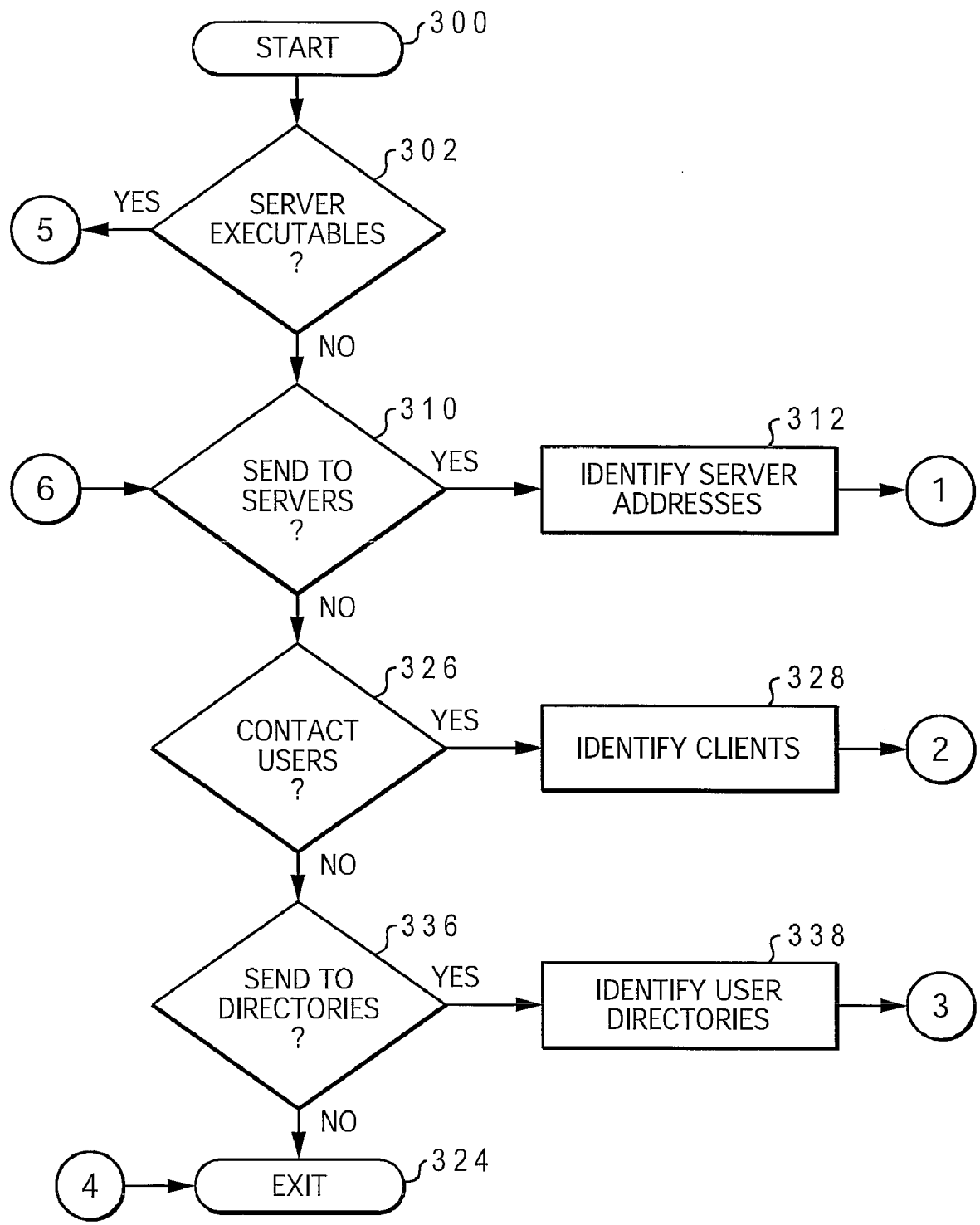
FIGS. 3a-b show a flow-chart of steps taken to deploy software capable of executing the steps shown in FIG. 2.
Figure 3B:
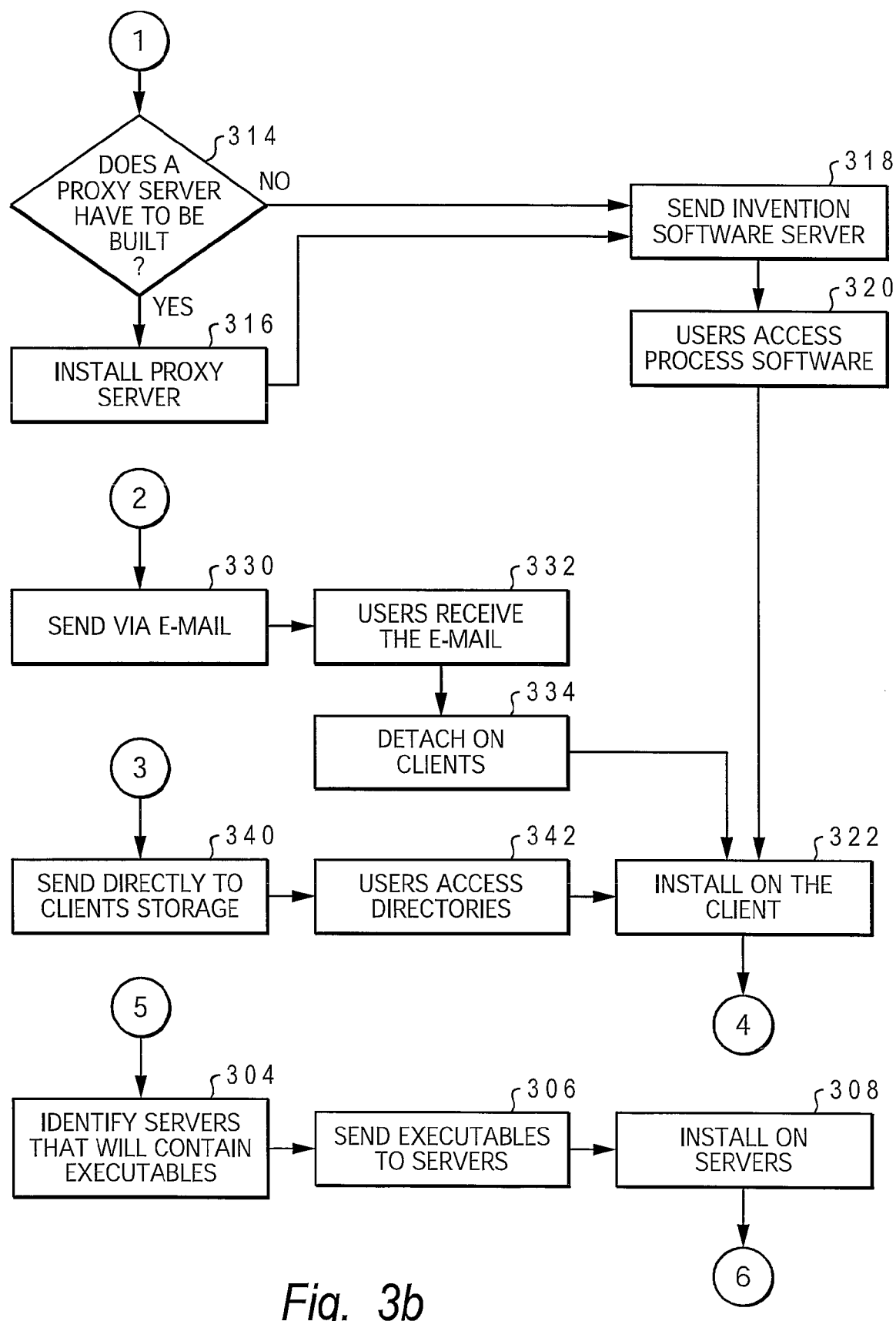

Thus, the method described herein, and in particular as shown in FIG. 2, can be deployed as a process software. Referring now to FIG. 3, step 300 begins the deployment of the process software. The first thing is to determine if there are any programs that will reside on a server or servers when the process software is executed (query block 302). If this is the case, then the servers that will contain the executables are identified (block 304). The process software for the server or servers is transferred directly to the servers' storage via File Transfer Protocol (FTP) or some other protocol or by copying though the use of a shared file system (block 306). The process software is then installed on the servers (block 308).

Next, a determination is made on whether the process software is be deployed by having users access the process software on a server or servers (query block 310). If the users are to access the process software on servers, then the server addresses that will store the process software are identified (block 312).

A determination is made if a proxy server is to be built (query block 314) to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required, then the proxy server is installed (block 316). The process software is sent to the servers either via a protocol such as FTP or it is copied directly from the source files to the server files via file sharing (block 318). Another embodiment would be to send a transaction to the servers that contained the process software and have the server process the transaction, then receive and copy the process software to the server's file system. Once the process software is stored at the servers, the users via their client computers, then access the process software on the servers and copy to their client computers file systems (block 320). Another embodiment is to have the servers automatically copy the process software to each client and then run the installation program for the process software at each client computer. The user executes the program that installs the process software on his client computer (block 322) then exits the process (terminator block 324).

In query step 326, a determination is made whether the process software is to be deployed by sending the process software to users via e-mail. The set of users where the process software will be deployed are identified together with the addresses of the user client computers (block 328). The process software is sent via e-mail to each of the users' client computers (block 330). The users then receive the e-mail (block 332) and then detach the process software from the e-mail to a directory on their client computers (block 334). The user executes the program that installs the process software on his client computer (block 322) then exits the process (terminator block 324).

Lastly a determination is made on whether to the process software will be sent directly to user directories on their client computers (query block 336). If so, the user directories are identified (block 338). The process software is transferred directly to the user's client computer directory (block 340). This can be done in several ways such as but not limited to sharing of the file system directories and then copying from the sender's file system to the recipient user's file system or alternatively using a transfer protocol such as File Transfer Protocol (FTP). The users access the directories on their client file systems in preparation for installing the process software (block 342). The user executes the program that installs the process software on his client computer (block 322) and then exits the process (terminator block 324).

VPN Deployment

The present software can be deployed to third parties as part of a service wherein a third party VPN service is offered as a secure deployment vehicle or wherein a VPN is build on-demand as required for a specific deployment.

A virtual private network (VPN) is any combination of technologies that can be used to secure a connection through an otherwise unsecured or untrusted network. VPNs improve security and reduce operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee. Access to the software via a VPN can be provided as a service by specifically constructing the VPN for purposes of delivery or execution of the process software (i.e. the software resides elsewhere) wherein the lifetime of the VPN is limited to a given period of time or a given number of deployments based on an amount paid.

The process software may be deployed, accessed and executed through either a remote-access or a site-to-site VPN. When using the remote-access VPNs the process software is deployed, accessed and executed via the secure, encrypted connections between a company's private network and remote users through a third-party service provider. The enterprise service provider (ESP) sets a network access server (NAS) and provides the remote users with desktop client software for their computers. The telecommuters can then dial a toll-bee number or attach directly via a cable or DSL modem to reach the NAS and use their VPN client software to access the corporate network and to access, download and execute the process software.

When using the site-to-site VPN, the process software is deployed, accessed and executed through the use of dedicated equipment and large-scale encryption that are used to connect a companies multiple fixed sites over a public network such as the Internet.

The process software is transported over the VPN via tunneling which is the process the of placing an entire packet within another packet and sending it over a network. The protocol of the outer packet is understood by the network and both points, called runnel interfaces, where the packet enters and exits the network.

Figure 4A:
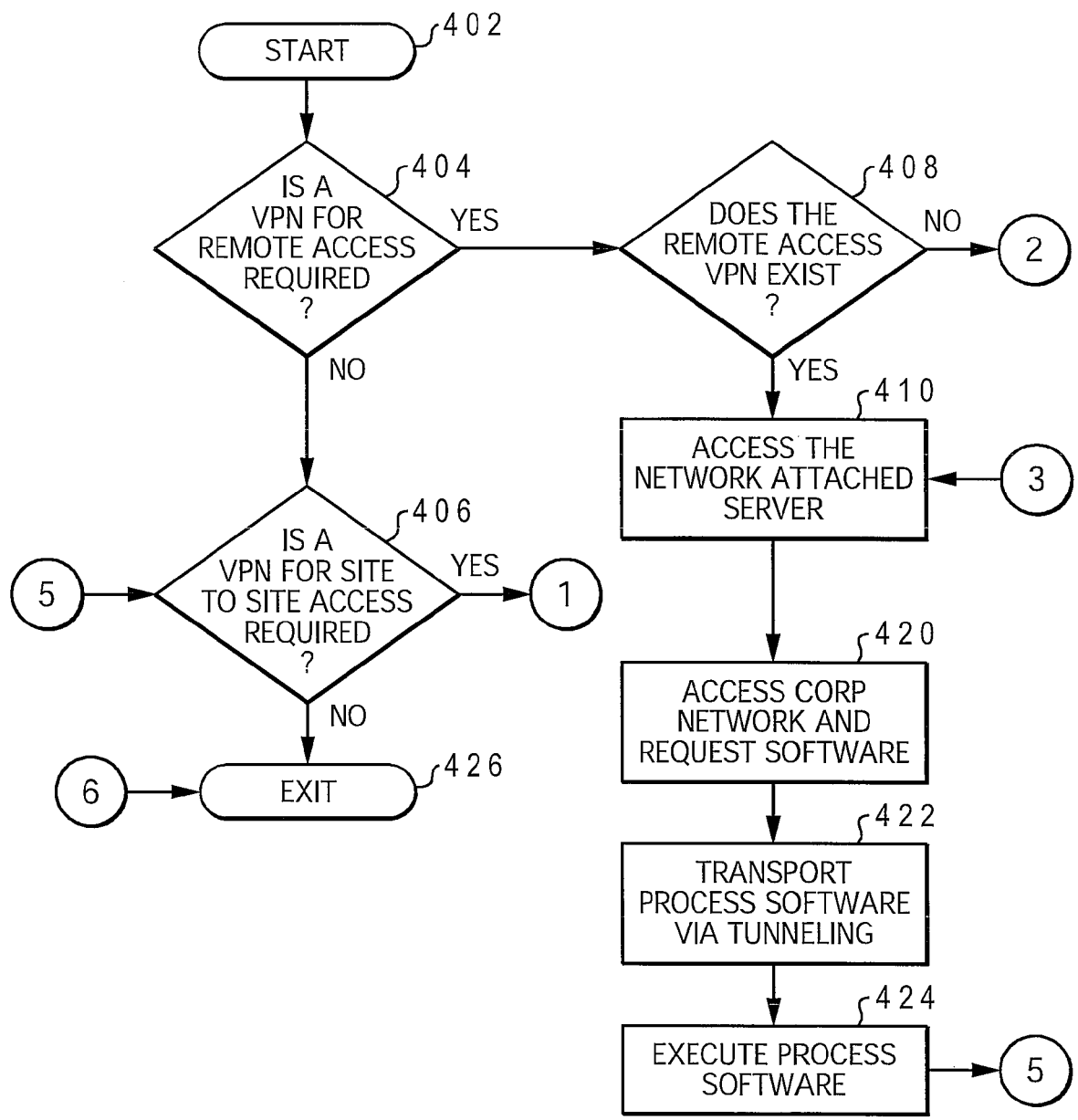

The process for such VPN deployment is described in FIG. 4. Initiator block 402 begins the Virtual Private Network (VPN) process. A determination is made to see if a VPN for remote access is required (query block 404). If it is not required, then proceed to (query block 406). If it is required, then determine if the remote access VPN exists (query block 408).

If a VPN does exist, then proceed to block 410. Otherwise identify a third party provider that will provide the secure, encrypted connections between the company's private network and the company's remote users (block 412). The company's remote users are identified (block 414). The third party provider then sets up a network access server (NAS) (block 416) that allows the remote users to dial a toll free number or attach directly via a broadband modem to access, download and install the desktop client software for the remote-access VPN (block 418).

After the remote access VPN has been built or if it been previously installed, the remote users can access the process software by dialing into the NAS or attaching directly via a cable or DSL modem into the NAS (block 410). This allows entry into the corporate network where the process software is accessed (block 420). The process software is transported to the remote user's desktop over the network via tunneling. That is the process software is divided into packets and each packet including the data and protocol is placed within another packet (block 422). When the process software arrives at the remote user's desk-top, it is removed from the packets, reconstituted and then is executed on the remote users desk-top (block 424).

A determination is then made to see if a VPN for site to site access is required (query block 406). If it is not required, then proceed to exit the process (terminator block 426). Otherwise, determine if the site to site VPN exists (query block 428). If it does exist, then proceed to block 430. Otherwise, install the dedicated equipment required to establish a site to site VPN (block 432). Then build the large scale encryption into the VPN (block 434).

After the site to site VPN has been built or if it had been previously established, the users access the process software via the VPN (block 430). The process software is transported to the site users over the network via tunneling (block 432). That is the process software is divided into packets and each packet including the data and protocol is placed within another packet (block 434). When the process software arrives at the remote user's desktop, it is removed from the packets, reconstituted and is executed on the site users desktop (block 436). The process then ends at terminator block 426.

Software Integration

The process software which consists code for implementing the process described herein may be integrated into a client, server and network environment by providing for the process software to coexist with applications, operating systems and network operating systems software and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists matches the parameter lists required by the process software. Conversely parameters passed by the software applications to the process software will be checked to ensure the parameters match the parameters required by the process software. The client and server operating systems including the network operating systems will be identified and compared to the list of operating systems, version numbers and network software that have been tested to work with the process software. Those operating systems, version numbers and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 5A:
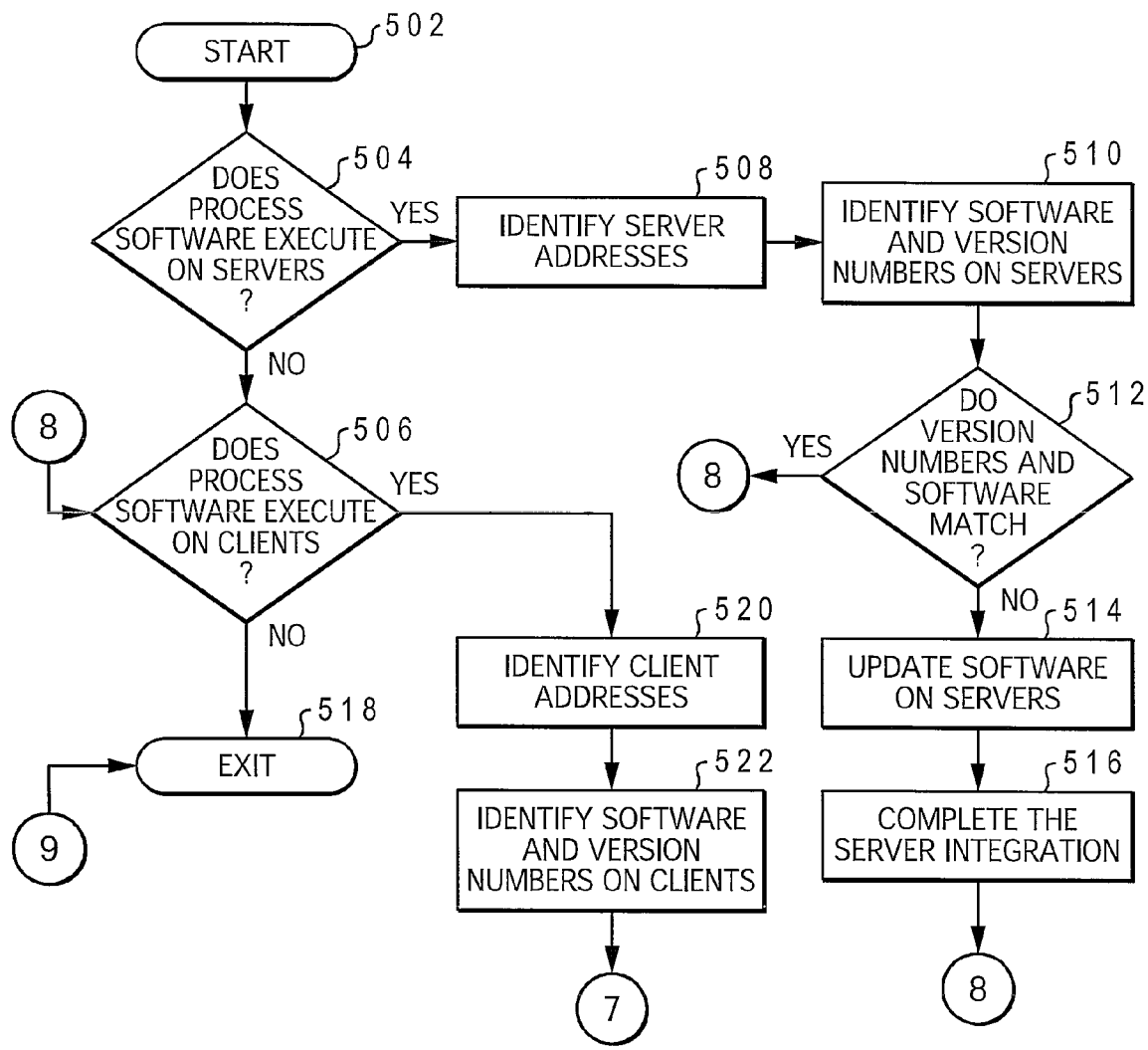
FIGS. 5a-b show a flow-chart showing steps taken to integrate into an computer system software that is capable of executing the steps shown in FIG. 2.
Figure 5B:
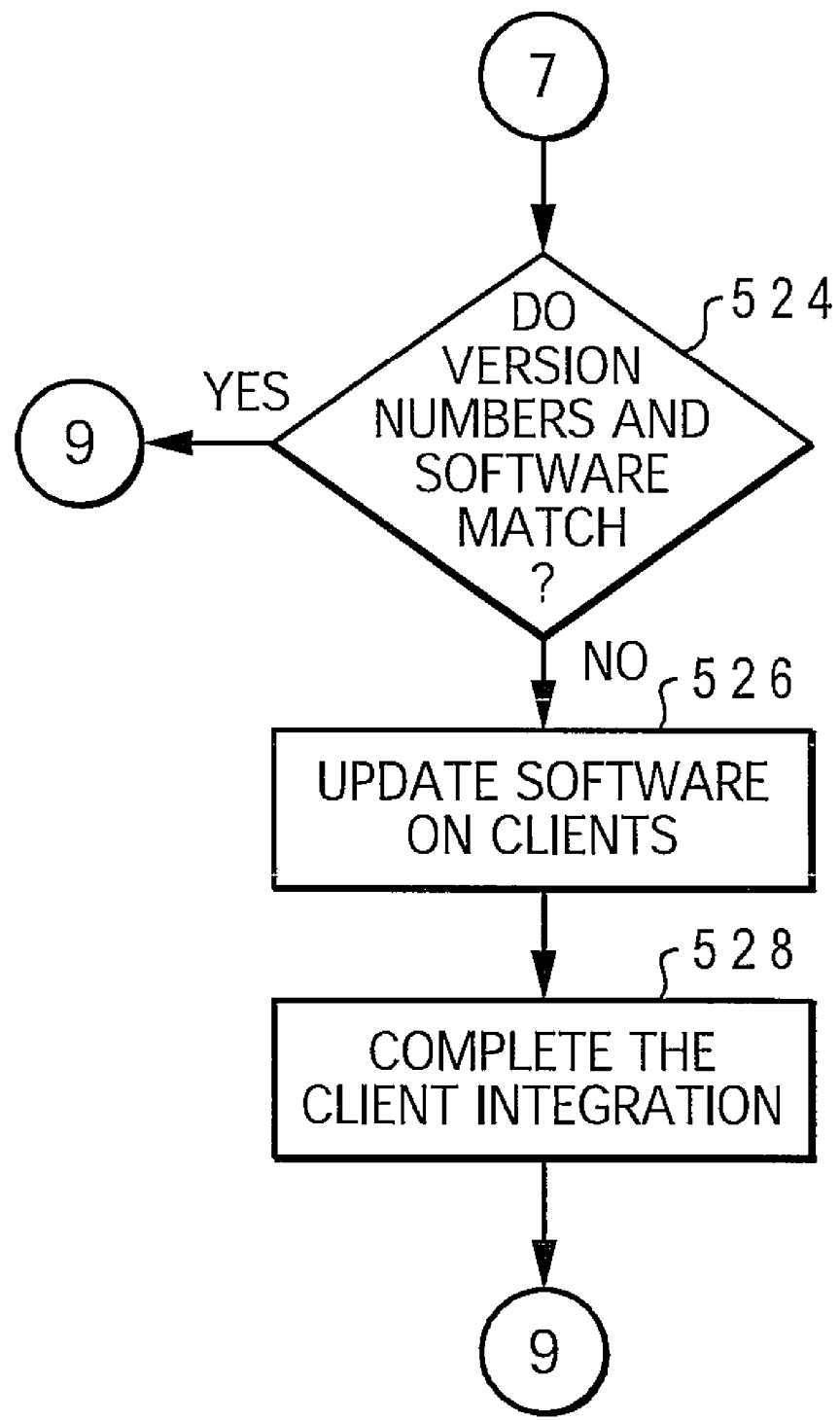

For a high-level description of this process, reference is now made to FIG. 5. Initiator block 502 begins the integration of the process software. The first tiling is to determine if there are any process software programs that will execute on a server or servers (block 504). If this is not the case, then integration proceeds to query block 506. If this is the case, then the server addresses are identified (block 508). The servers are checked to see if they contain software that includes the operating system (OS), applications, and network operating systems (NOS), together with their version numbers, which have been tested with the process software (block 510). The servers are also checked to determine if there is any missing software that is required by the process software in block 510.

A determination is made if the version numbers match the version numbers of OS, applications and NOS that have been tested with the process software (block 512). If all of the versions match and there is no missing required software the integration continues in query block 506.

If one or more of the version numbers do not match, then the unmatched versions are updated on the server or servers with the correct versions (block 514). Additionally, if there is missing required software, then it is updated on the server or servers in the step shown in block 514. The server integration is completed by installing the process software (block 516).

The step shown in query block 506, which follows either the steps shown in block 504, 512 or 516 determines if there are any programs of the process software that will execute on the clients. If no process software programs execute on the clients the integration proceeds to terminator block 518 and exits. If this not the case, then the client addresses are identified as shown in block 520.

The clients are checked to see if they contain software that includes the operating system (OS), applications, and network operating systems (NOS), together with their version numbers, which have been tested with the process software (block 522). The clients are also checked to determine if there is any missing software that is required by the process software in the step described by block 522.

A determination is made is the version numbers match the version numbers of OS, applications and NOS that have been tested with the process software (query block 524). If all of the versions match and there is no missing required software, then the integration proceeds to terminator block 518 and exits.

If one or more of the version numbers do not match, then the unmatched versions are updated on the clients with the correct versions (block 526). In addition, if there is missing required software then it is updated on the clients (also block 526). The client integration is completed by installing the process software on the clients (block 528). The integration proceeds to terminator block 518 and exits.

On Demand

The process software is shared, simultaneously serving multiple customers in a flexible, automated fashion. It is standardized, requiring little customization and it is scalable, providing capacity on demand in a pay-as-you-go model.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise when other measurements of use such as network bandwidth, memory usage, storage usage, etc. approach a capacity so as to affect performance, additional network bandwidth, memory usage, storage etc. are added to share the workload.

The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider.

In another embodiment, the service provider requests payment directly from a customer account at a banking or financial institution.

In another embodiment, if the service provider is also a customer of the customer that uses the process software application, the payment owed to the service provider is reconciled to the payment owed by the service provider to minimize the transfer of payments.

Figure 6A:
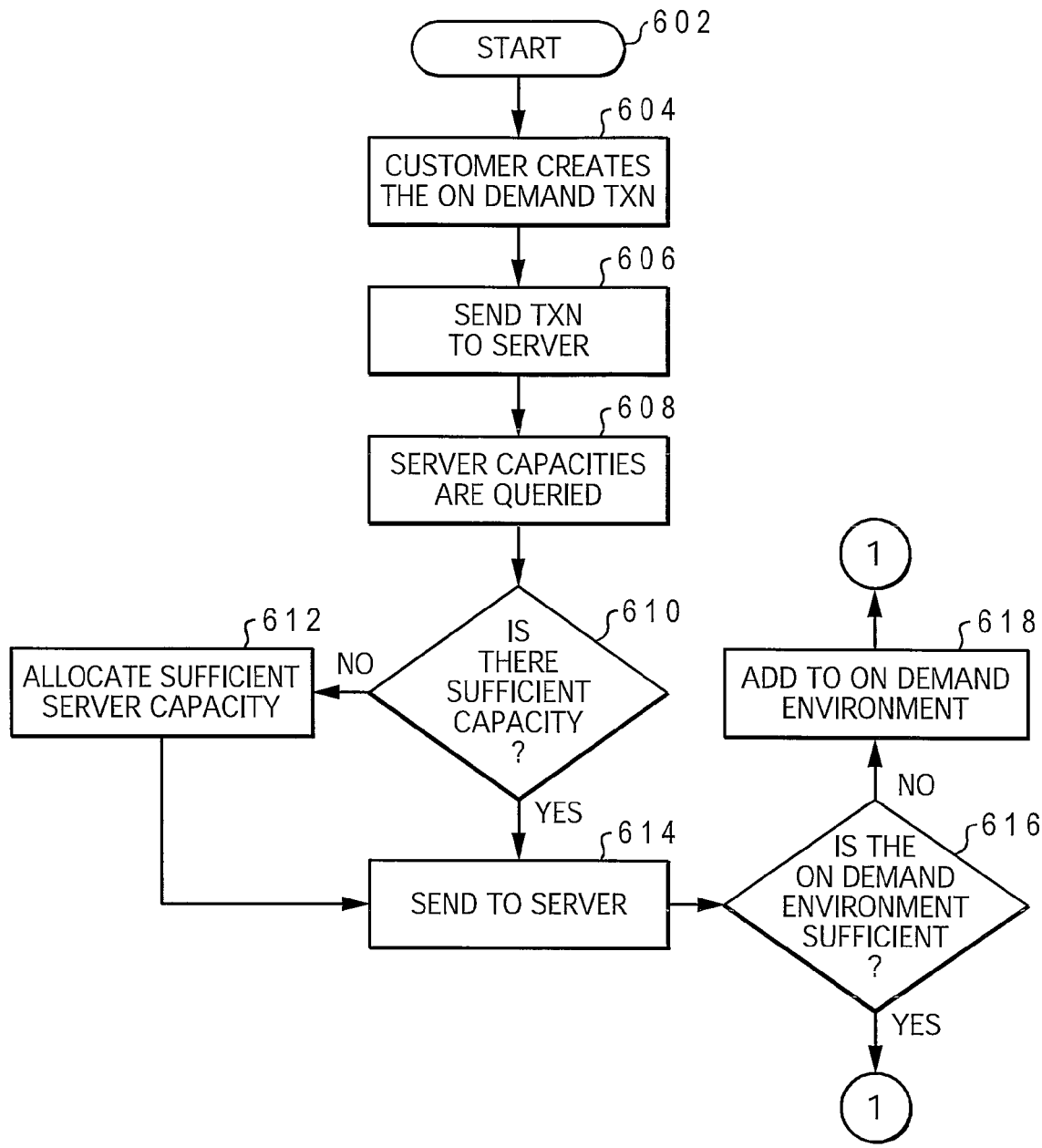
FIGS. 6a-b show a flow-chart showing steps taken to execute the steps shown in FIG. 2 using an on-demand service provider.
Figure 6B:
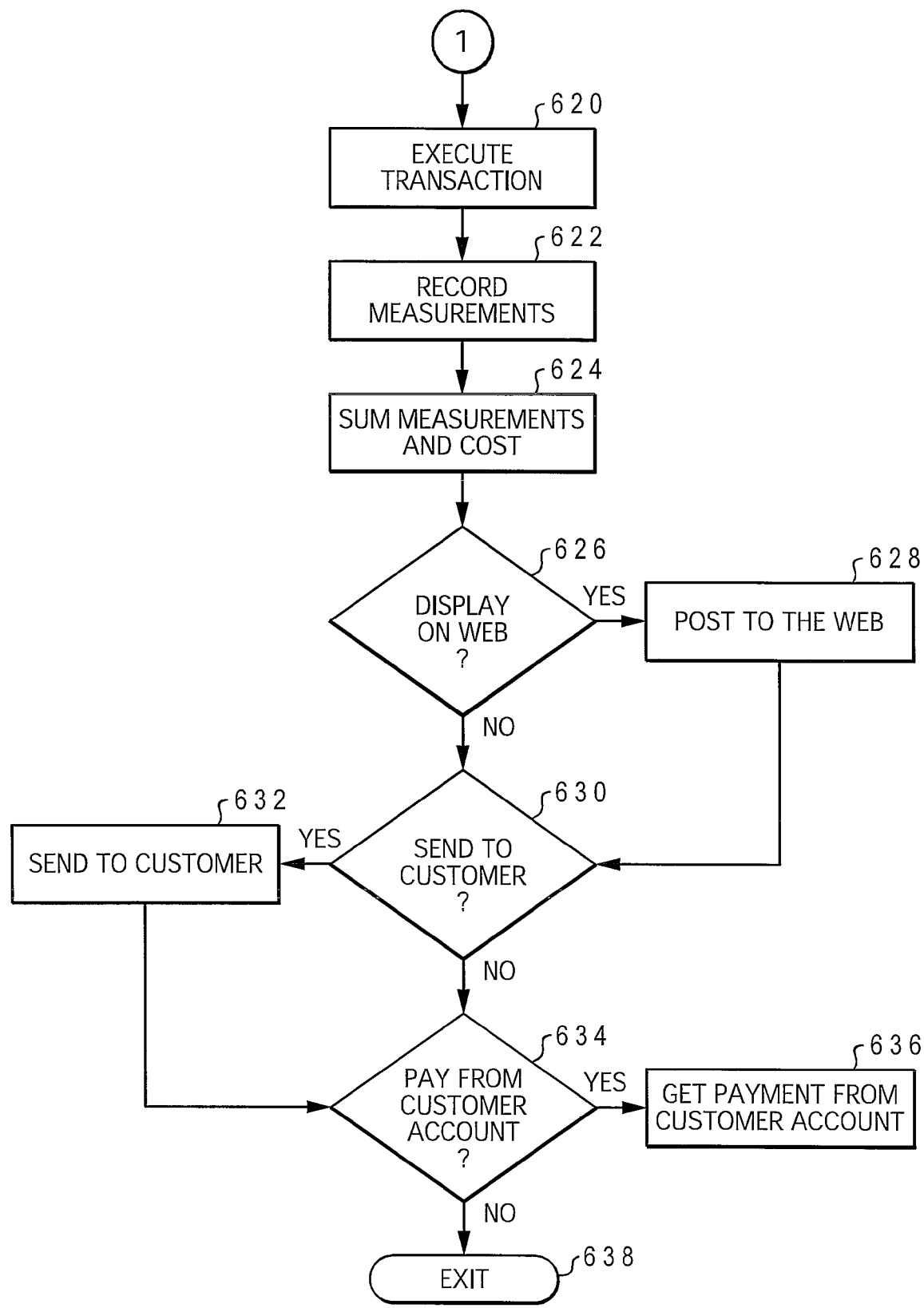

With reference now to FIG. 6, initiator block 602 begins the On Demand process. A transaction is created than contains the unique customer identification, the requested service type and any service parameters that further, specify the type of service (block 604). The transaction is then sent to the main server (block 606). In an On Demand environment the main server can initially be the only server, then as capacity is consumed other servers are added to the On Demand environment.

The server central processing unit—(CPU) capacities in the On Demand environment are queried (block 608). The CPU requirement of the transaction is estimated, then the servers available CPU capacity in the On Demand environment are compared to the transaction CPU requirement to see if there is sufficient CPU available capacity in any server to process the transaction (query block 610). If there is not sufficient server CPU available capacity, then additional server CPU capacity is allocated to process the transaction (block 612). If there was already sufficient Available CPU capacity then the transaction is sent to a selected server (block 614).

Before executing the transaction, a check is made of the remaining On Demand environment to determine if the environment has sufficient available capacity for processing the transaction. This environment capacity consists of such things as but not limited to network bandwidth, processor memory, storage etc. (block 616). If there is not sufficient available capacity, then capacity will be added to the On Demand environment (block 618). Next the required software to process the transaction is accessed, loaded into memory, then the transaction is executed (block 620).

The usage measurements are recorded (block 622). The usage measurements consist of the portions of those functions in the On Demand environment that are used to process the transaction. The usage of such functions as, but not limited to, network bandwidth, processor memory, storage and CPU cycles are what is recorded. The usage measurements are summed, multiplied by unit costs and then recorded as a charge to the requesting customer (block 624).

If the customer has requested that the On Demand costs be posted to a web site (query block 626), then they are posted (block 628). If the customer has requested that the On Demand costs be sent via e-mail to a customer address (query block 630), then these costs are sent to the customer (block 632). If the customer has requested that the On Demand costs be paid directly from a customer account (query block 634), then payment is received directly from the customer account (block 636). The On Demand process is then exited at terminator block 638.

While the invention has been particularly shown as described with reference to a preferred embodiment, it will be understood by those skilled in the art that various changes in form and detail may be made therein without departing from the spirit and scope of the invention. It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communication links.

What is claimed is:

1. A data processing system for performing verification, said data processing system comprising:
   a processor; and
   data storage coupled to the processor, the data storage including program code stored within the data storage that, when executed by the processor, causes the data processing system to obtain an overapproximated netlist with low input count by:
      selecting a set of gates to add to a first localization netlist;
      forming a refinement netlist by adding the selected set of gates to the first localization netlist;
      computing a min-cut with sinks comprising one or more gates in said refinement netlist and sources comprising one or more inputs of an original netlist and one or more registers of said original netlist which are not part of said refinement netlist, wherein computing said min-cut further comprises, upon determining a register to be within said set of gates, computing said min-cut on both a next state and an initial value cone of said register; and
      obtaining a final localized netlist by adding one or more gates to said refinement netlist to grow said refinement netlist until reaching one or more cut-gates of said min-cut;
   wherein said program code causes the data processing system to perform the forming, computing, and obtaining iteratively in response to detection of one or more spurious counterexamples on said final localized netlist.

2. The data processing system of claim 1, wherein the program code further causes the data processing system to perform forming said first localization netlist and said set of gates from a set of one or more registers and one or more non-registers.

3. A program product, comprising:
   a non-transitory machine-usable storage medium; and
   program code stored within the machine-usable storage medium, wherein said program code, when processed by a machine, causes said machine to obtain an overapproximated netlist with low input count by:
      selecting a set of gates to add to a first localization netlist by adding the selected set of gates to the first localization netlist;
      forming a refinement netlist;
      computing a min-cut with sinks comprising one or more gates in said refinement netlist and sources comprising one or more inputs of an original netlist and one or more registers of said original netlist which are not part of said refinement netlist, wherein computing said min-cut further comprises, upon determining a register to be within said set of gates, computing said min-cut on both a next state and an initial value cone of said register; and
      obtaining a final localized netlist by adding one or more gates to said refinement netlist to grow said refinement netlist until reaching one or more cut-gates of said min-cut;
   wherein said program code causes the machine to perform the forming, computing, and obtaining iteratively in response to detection of one or more spurious counterexamples on said final localized netlist.

4. The program product of claim 3, wherein said program code further causes the machine to perform forming said first localization netlist and said set of gates from a set of one or more registers and one or more non-registers.

5. The program product of claim 3, wherein the program code is deployed to a server from a remote location.

6. The program product of claim 3, wherein the program code is provided by a service provider to a customer on an on-demand basis.

* * * * *